United States Patent [19]
Colles

[11] Patent Number: 5,274,275
[45] Date of Patent: Dec. 28, 1993

[54] COMPARATOR

[75] Inventor: Joseph H. Colles, Vista, Calif.

[73] Assignee: Brooktree Corporation, San Diego, Calif.

[21] Appl. No.: 979,803

[22] Filed: Nov. 20, 1992

Related U.S. Application Data

[63] Continuation of Ser. No. 677,152, Mar. 29, 1991, abandoned.

[51] Int. Cl.$^5$ .......................... H03K 5/153; H03K 5/24
[52] U.S. Cl. ...................................... 307/362; 307/354; 307/355; 307/530; 307/494
[58] Field of Search ................ 307/354, 360, 362, 279, 307/530, 355, 491, 494

[56] References Cited

U.S. PATENT DOCUMENTS

| | | | |
|---|---|---|---|
| 4,511,810 | 4/1985 | Yukawa | 307/362 |
| 4,521,703 | 6/1985 | Dingwall | 307/530 |
| 4,814,642 | 3/1989 | Kleks | 307/362 |
| 4,814,648 | 3/1989 | Hynecek | 307/279 |

Primary Examiner—John Zazworsky
Attorney, Agent, or Firm—Ellsworth R. Roston; Charles H. Schwartz

[57] ABSTRACT

A comparator indicates the relative magnitudes of input and reference signals with improved immunity to noise signals. The comparator includes first and second transistors differentially connected to receive the input and reference signals. Third and fourth transistors connected in a latching relationship are responsive in first alternate half cycles of clock signals to the outputs from the first and second transistors to provide a regenerative action on these outputs. In first portions of the first alternate half cycles of the clock signals, a degenerative action is provided by fifth and sixth transistors respectively on the third and fourth transistors to prevent the third and fourth transistors from regenerating until the input difference voltage of these transistors has had time to increase relative to the input noise on these transistors. The fifth and sixth transistors may be provided with sizes corresponding to, or preferably sightly greater than, those of the third and fourth transistors. A seventh transistor connected to the fifth and sixth transistors provides current flow through the fifth and sixth transistors during the second alternative half cycles, and only during the first portion of the first alternate half cycles of the clock signals. An eighth transistor connected to the third and fourth transistors balances the operation of the third, fourth and eighth transistors with the operation of the fifth, sixth and seventh transistors. In the second alternate half cycles of the clock signals, a math transistor clamps the third and fourth transistors to a common voltage level.

23 Claims, 2 Drawing Sheets

COMPARATOR

This is a continuation of application Ser. No. 07/677,152 filed Mar. 29, 1991, now abandoned.

This invention relates to comparators and more particularly relates to comparators for use in analog-to-digital converters to indicate the digital values of analog input signals.

Most parameters such as temperature and pressure are generally analog. For example, measurements of temperature on a conventional mercury thermometer are analog and measurements of pressure in a conventional bourdon tube may be analog. In digital computers and data processing systems, these analog parameters are converted to corresponding digital values so that these values can be processed with other information in the digital computers or data processing systems. The resultant digital information from the digital computers or data processing systems may then be converted to analog values which control adjustments in the values of the parameters such as temperature or pressure.

Another example of analog measurements may be the intensity of light in a color image and the intensity of the primary colors such as red, green and blue at each pixel position in a color image. These analog parameters may be converted to corresponding digital indications and recorded in digital form on a tape. When it is desired to reproduce the color information, the digital information on the tape may be converted back to the analog representations for each pixel position in the color image. It has been found that the conversion of visual images in analog form to digital indications for storage on a tape provides a higher resolution—or accuracy—than an analog negative of the image on a photographic film.

Analog-to-digital (A-D) converters are generally more difficult to design and construct than digital-to-analog converters. One type of A-D converter provides a plurality of comparators each with two (2) input terminals. One input terminal of each comparator receives an input voltage whose magnitude is to be converted to a digital value. The other input terminal of each comparator receives an individual one of a plurality of reference voltages of progressively increasing value. Each comparator accordingly determines whether the input voltage is less or greater than the individual value of the reference voltage introduced to such comparator.

Successive pairs of comparators are then connected in logical gates. Only one of the logical gates will provide an indication that, in one of the comparators connected to such logical gate, the input voltage is greater than the reference voltage introduced to such comparator and in the other of the comparators connected to such logical gate, the input voltage is less than the reference voltage introduced to such gate. When activated, each of these logical gates provides an individual digital indication of the value of the input signal.

Analog-to-digital converters of the type discussed in the previous paragraph have existed for a considerable period of time such as in the order of decades. The comparators in these A-D converters have generally been constructed in what has come to be recognized as a standard pattern. Each comparator is formed from first and second transistors which respectively receive the input and reference voltages in first alternate half cycles of clock signals. Third and fourth transistors connected in a latching relationship respectively receive the outputs from the first and second transistors and regenerate the difference in the voltages from the first and second transistors to provide a latched output representative of such difference. The regenerative operation of the third and fourth transistors causes these transistors to provide a latched output in a relatively short period of time.

Problems exist now in the accuracy of the outputs obtained from comparators of the type discussed in the previous paragraph. These problems have existed in such comparators for a considerable period of time in the order of decades. One problem has resulted from the fact that the comparators have become latched at times by noise signals rather than by the differences between the input and reference voltages introduced to the comparators.

In one embodiment of the invention a comparator indicates the relative magnitudes of input and reference signals with improved immunity to noise signals. The comparator includes first and second transistors differentially connected to receive the input and reference signals. Third and fourth transistors connected in a latching relationship are responsive in first alternate half cycles of clock signals to the outputs from the first and second transistors to provide a regenerative action on those outputs.

In first portions of the first alternate half cycles of the clock signals, a degenerative action is provided by fifth and sixth transistors respectively on the third and fourth transistors to prevent the third and fourth transistors from regenerating until the input difference voltage of these transistors has had time to increase relative to input noise on these transistors. The fifth and sixth transistors may be provided with sizes corresponding to, or preferably slightly greater than, those of the third and fourth transistors.

A seventh transistor may be connected to the fifth and sixth transistors to provide a flow of current through the fifth and sixth transistors only during the first portion of the first alternate half cycles of the clock signals. An eighth transistor may be connected to the third and fourth transistors to balance the operation of the third, fourth and eighth transistors with the operation of the fifth, sixth and seventh transistors.

In the other alternate half cycles of the clock signals, the third and fourth transistors may be clamped, as by a ninth transistor, to a common voltage level. The ninth transistor may be connected between the third and fourth transistors.

Figure 1:
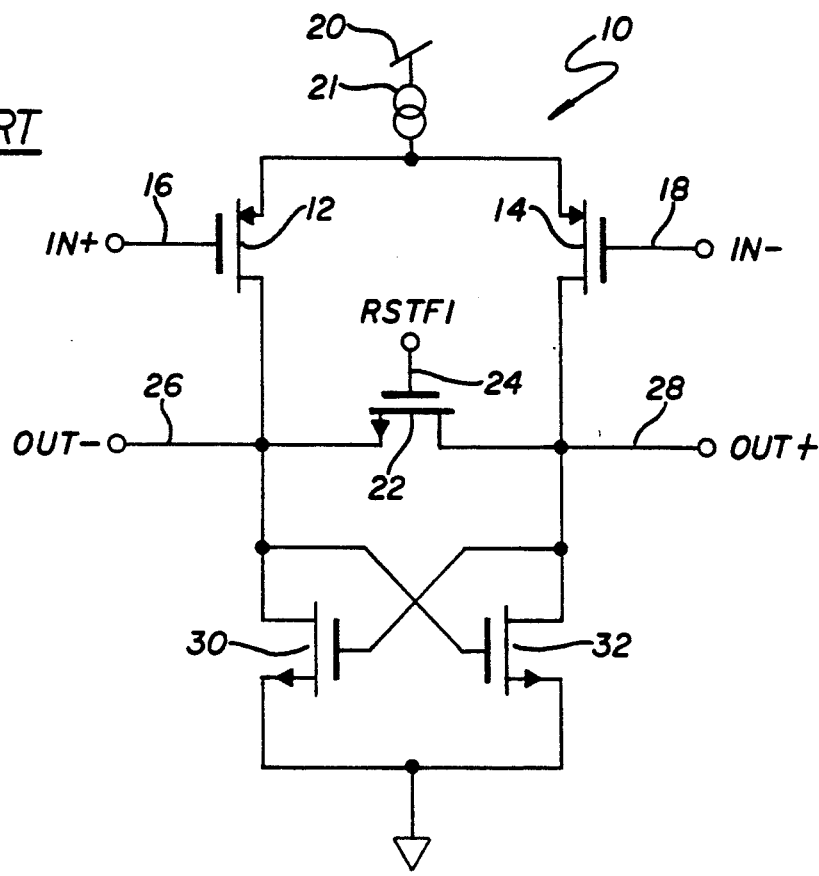
FIG. 1 is a circuit diagram of a prior art comparator for use in an analog-to-digital converter.

FIG. 1 illustrates a comparator, generally indicated at 10, of the prior art. The comparator 10 is shown as being constructed of CMOS transistors but it will be appreciated that the comparator may be constructed of other types of transistors such as bi-polar transistors. In the prior art embodiment shown in FIG. 1, gates of transistors 12 and 14 respectively receive an input signal or voltage on a line 16 and a reference signal or voltage on a line 18. The transistors 12 and 14 are shown as p-type transistors, the sources of which receive a suitable energizing voltage such as approximately +5 volts from a supply 20. A source 21 of constant current may be disposed electrically between the voltage supply 20 and the sources of the transistors 12 and 14.

The drains of the transistors 12 and 14 are respectively common with the source and drain of a transistor 22, which may be of the n-type. The gate of the transistor 22 receives clock signals on a line 24 from a source (not shown) of clock signals. Output lines 26 and 28 are respectively connected to the source and drain of the transistor 22. Connections are made from the line 26 to the drain of a transistor 30 and the gate of a transistor 32. Both of the transistors 30 and 32 may be n-type transistors. In like manner, the line 28 is connected to the drain of the transistor 32 and the gate of the transistor 30. The sources of the transistors 30 and 32 may be common with a reference potential such as ground.

An input voltage and a reference voltage are respectively introduced on the lines 16 and 18 (as indicated at 40 and 42 in FIG. 2) to make the transistors 12 and 14 conductive. This causes positive voltages to be produced on the drains of the transistors 12 and 14. In the positive half cycles (indicated at 44 in FIG. 1 and in FIG. 2) of the clock signal RSTP1 on the line 24, the transistor 22 become conductive to clamp the source and drain of the transistor 22 with a common voltage indicated at 46 in FIG. 2. This neutralizes any difference in the voltages produced on the lines 26 and 28 in the previous half cycle of the clock signals. The clamping of the output lines 26 and 28 with a common voltage is indicated in FIG. 2 by the designation "clamping" to the left of a broken line 48 in FIG. 2.

Figure 2:
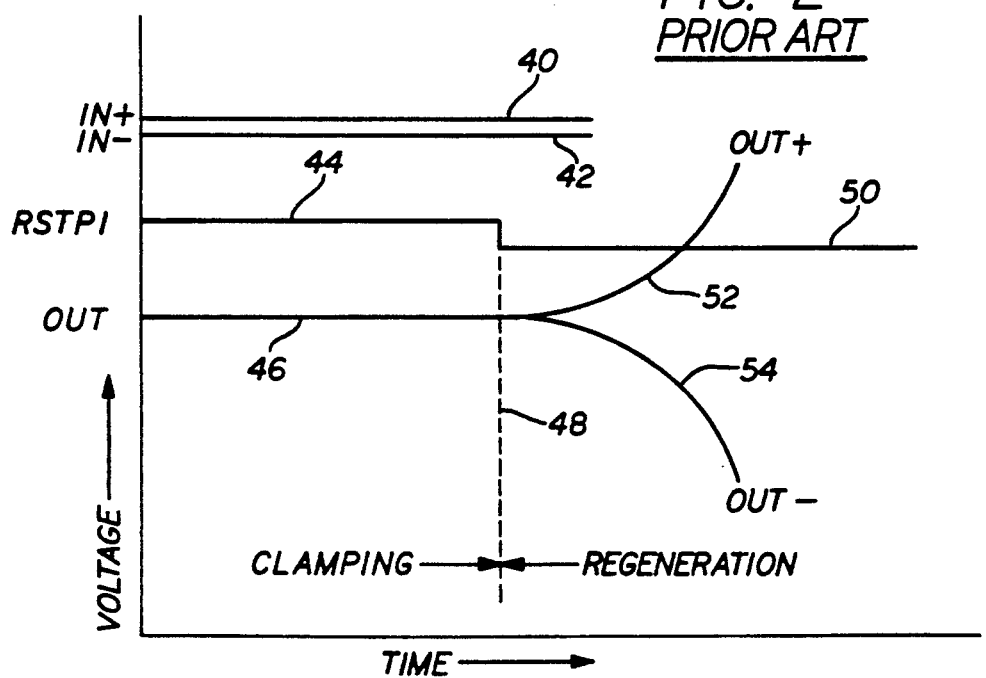
FIG. 2 shows voltage waveforms in relationship to time at strategic terminals in the prior art comparator of FIG. 1.

The negative half cycles of the clock signals on the line 24 are indicated at 50 in FIG. 2. During this period, the transistors 30 and 32 are conductive because of the positive voltages on their gates. However, in the example shown in FIG. 2, the transistor 30 is more conductive than the transistor 32 because the magnitude of the voltage 42 on the line 18 is lower than the magnitude of the voltage 40 on the line 18, as indicated by "IN+" and "IN—" designations in FIGS. 1 and 2. This causes the transistor 14 to be more conductive than the transistor 12 and the voltage introduced to the gate of the transistor 30 to be more positive than the voltage introduced to the gate of the transistor 32. Since the transistor 30 is more conductive than the transistor 32, the voltage on the drain of the transistor 30 is lower than the voltage on the drain of the transistor 32. This produces a regenerative action which causes the transistor 30 to provide a saturated current quickly and the transistor 32 to approach cut-off.

The progressively increasing current flow through the transistors 14 and 30 causes the voltage on the output line 28 to rise rapidly as indicated at 52 in FIG. 1 and the voltage on the output line 26 to fall rapidly as indicated at 54 in FIG. 1. This is also indicated in FIGS. 1 and 2 by the designations "OUT+" and "OUT—". The latch formed by the transistors 30 and 32 accordingly acts regeneratively as indicated by the word "regeneration" in FIG. 2 to the right of the broken lines 48.

The previous paragraphs describe the idealized operation of the comparator 10 shown in FIG. 1. However, the operation of the comparator 10 is not always idealized. For example, noise signals introduced to the gates of the transistors 30 and 32 at the beginning of the negative half cycles 50 of the clock signals may cause the comparator 10 to provide an incorrect output. Specifically, in the example discussed above and shown in FIG. 1, noise signals at the beginning of the negative half cycles 50 may cause the voltage on the line 18 to be more positive than the voltage on the line 16. Because of the regenerative action of the transistors 30 and 32, this may cause the latch formed by the cross-coupled transistors 30 and 32 to produce a high voltage on the output line 26 and a low voltage on the output line 28. This is directly contrary to the results shown in FIG. 1.

Figure 3:
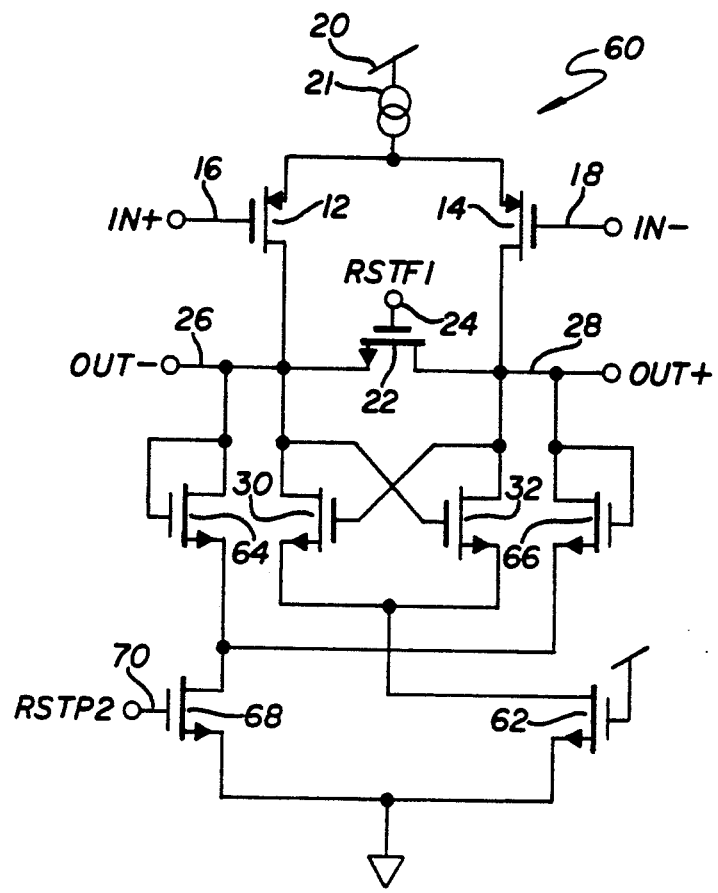
FIG. 3 is a circuit diagram of a comparator constituting one embodiment of the invention.

FIG. 3 illustrates one embodiment of a comparator generally indicated at 60 for insuring that correct output voltages will be produced on the output lines 26 and 28 with decreased sensitivity to noise in transistors 30 and 32. In the embodiment shown in FIG. 3, transistors corresponding to those shown in FIG. 1 are given the same numerical designations as in the embodiment shown in FIG. 1. However, in the embodiment shown in FIG. 3, a transistor 62, preferably of the n-type, has its drain connected to the sources of the transistors 30 and 32, its gate connected to the voltage source 20 and its source common with the reference potential such as ground.

The drain and the gate of a transistor 64, preferably n-type, are connected to the output line 26 and the drain and the gate of a transistor 66, also preferably n-type, are common with the output line 28. Connections are made from the sources of the transistors 64 and 66 to the drain of a transistor 68, which may be of the n-type. The gate of the transistor 68 receives the clock signals on a line 70. The source of the transistor 68 may be at the reference potential such as ground.

The transistor 68 preferably has characteristics matched to those of the transistor 62; and the transistors 30, 32, 64 and 66 may have matched characteristics. Preferably, however, the transistors 30 and 32 have matched characteristics, the transistors 64 and 66 have matched characteristics and the sizes of the transistors 64 and 66 are slightly larger than those of the transistors 30 and 32.

Figure 4:
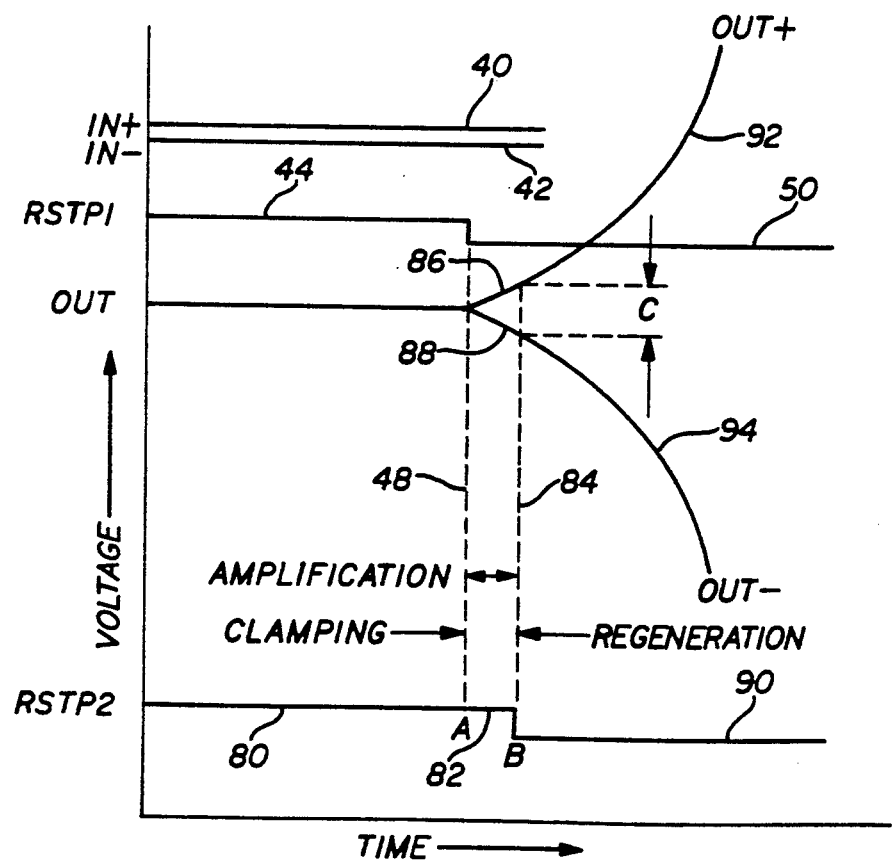
FIG. 4 shows voltage waveforms in relationship to time at strategic terminals in the comparator of FIG. 3.

In the embodiment of the invention shown in FIG. 3, the clock signals on the line 70 are provided with a high voltage level in the same half cycles as the positive half cycles 44 of the clock signals on line 24 and shown in FIG. 2. This is illustrated at 80 in FIG. 4. However, this high voltage level continues on the line 70 for a first time portion of the negative half cycles 50 of the clock signals on line 24 in FIG. 2. This is illustrated at 82 in FIG. 4. This time portion is defined in FIG. 4 as the period of time between the broken line 48 and the broken line 84. This resultant clock signal provided on the line 70 in FIG. 3 is designated as "RSTP2" in FIGS. 3 and 4. It will be appreciated, however, that the frequency of the clock signals on the line 70 corresponds to the frequency of the signals on the line 24 even though the signals on the line 20 have longer half cycles of positive amplitude and shorter half cycles of negative amplitude than the signals on the line 24.

During the time portions 80 and 82, the transistor 68 is conductive. During the time portion 82, the transistors 64 and 66 are conductive because of the difference in voltage on the lines 26 and 28. A portion of the current in the transistors 12 and 14 accordingly flows through the transistors 62 and 68. However, the current through the transistor 64 causes it to degenerate the regenerative action of the transistor 30. Similarly, the current through the transistor 66 causes it to degenerate the regenerative action of the transistor 32. The transistors 64 and 66 accordingly provide a degenerating action on the transistors 30 and 32 during the time period 82.

Because of the degenerating action provided by the transistors 64 and 66 in the time period 82, the transistors 30 and 32 are not able to regenerate in this time period. This degenerating action continues until the difference in the voltages on the output lines 26 and 28 becomes sufficiently great so as to diminish the effect of the noise signals on the inputs of the transistors 30 and 32. This degenerating action during the time period 82 is designated as "Amplification" in FIG. 4. The voltages produced on the output lines 26 and 28 during the time period 82 are respectively indicated at 86 and 88 in FIG. 4. They are designated in FIG. 4 by broken lines separated by a magnitude "C".

At the end of the time period 82, a low voltage 90 (FIG. 4) is introduced to the gate of the transistor 68. This voltage cuts off the transistor 68 from the flow of current, thereby interrupting the flow of current through the transistors 64 and 66. The transistors 30 and 32 are now able to provide the regenerating action discussed in connection with the embodiment shown in FIG. 1. This causes the transistors 30 and 32 to produce a latching action in respectively generating voltages 92 and 94 on the output lines 26 and 28. However, in producing this latching action, the effect of the noise signals on the inputs to the transistors 30 and 32 has been diminished by the amplification that has taken place during time period 82.

The operation of the circuitry shown in FIG. 3 is facilitated by the balanced relationship of the circuitry. For example, the transistors 30 and 32 preferably have the same characteristics and the transistors 64 and 66 may have the same characteristics as the transistors 30 and 32. Preferably, however, the transistors 64 and 66 have slightly larger sizes than the transistors 30 and 32 to insure that the transistors 64 and 66 will clamp the transistors 30 and 32 during the time period 82 and that the regenerative action of the transistors 30 and 32 will be degenerated during this time period. The balanced relationship between the transistors 62 and 68 also facilitates the operation of the transistors 64 and 66 in degenerating the regenerative action of the transistors 30 and 32 on a balanced basis during the time period 82.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in a comparator constructed to prevent the comparator from responding to noise signals, means for receiving at a particular frequency first clock signals alternately having positive and negative half cycles of equal durations, means for receiving an input signal, means for receiving a reference signal, means for receiving at the particular frequency second clock signals alternately having positive and negative half cycles of unequal duration, the positive half cycles of the second clock signals being longer than the negative half cycles of the second clock signals, latching signal means responsive to the input signal and the reference signal for providing in the negative half cycles of the first clock signals a latching signal representative of the difference between the input signal and the reference signal, means for clamping the latching signal means in the positive half cycles of the first clock signals, and control means operatively coupled to the latching signal means for controlling the operation of the latching signal means, during the time that the first clock signals are negative and the second clock signals are positive, to prevent the latching signal means from responding to noise signals in producing a latching signal during the negative half cycles of the first clock signals.

2. In a differential amplifier as set forth in claim 1, the latching signal means and the control means being constructed to facilitate the action of the control means in preventing the latching signal means from producing the latching signal during the time that the first clock signals are negative and the second clock signals are positive.

3. In a differential amplifier as set forth in claim 2, the latching signal means including first and second differentially connected transistors, the first transistor being responsive to the input signal during the negative half cycles of the first clock signals and the second transistor being responsive to the reference signal during the negative half cycles of the first clock signals to provide the latching signal in accordance with the difference between the input and reference signals, the control means including third and fourth transistors connected to the first and second transistors to provide a degenerative action in the response of the first and second transistors during the time that the first clock signals are negative and the second clock signals are positive.

4. In a combination as set forth in claim 1, the latching signal means including a pair of cross coupled transistors each responsive to an individual one of the input and reference signals during the negative half cycles of the first clock signals to provide the latching signal in accordance with the difference between the input and reference signals, and the control means being operative to limit the response of the first and second transistors to the input and reference signals during the negative half cycles of the first clock signals until the the first and second transistors are responsive only to the difference between the input and reference signals and not to any noise signals.

5. In combination in a comparator constructed to prevent the comparator from responding to noise signals, means for receiving first clock signals having a particular frequency alternately having positive and negative half cycles, means for receiving an input signal, means for receiving a reference signal, latched output means responsive to the input and reference signals and the first clock signals for providing a latched output in the negative half cycles of the first clock signals in accordance with an difference between the input and reference signals, means for clamping the latched output means in the positive half cycles of the first clock signals, and regulating means operatively coupled to the latched output means and responsive to the input and reference signals and the second clock signals for regulating the operation of the latched output means in the negative half cycles of the first clock signals until the latched output means is responsive only in accordance with the difference between the input and reference signals in producing the latched output.

6. In a comparator as set forth in claim 5 wherein the latched output means is responsive to the regulating means to operate in a degenerative state until the latched output means is responsive only in accordance with the difference between the input and reference signals in producing the latched output and the latched output means is operative in a regenerative state, after it becomes responsive, only in accordance with the difference between the input and reference signals in producing the latched output.

7. In a comparator as set forth in claim 6, the regulating means having characteristics substantially matched to the characteristics of the latched output means.

8. In a comparator as set forth in claim 5, the latched output means including a first pair of transistors connected in a regenerative relationship and the regulating means including a second pair of transistors connected to provide an operation of the first and second transistors in a degenerative relationship until the first and second transistors are responsive only in accordance with the difference between the input and reference signals in producing the latched output.

9. In a comparator constructed to prevent the comparator from responding to noise signals,
means for receiving an input signal,
means for receiving a reference signal,
means for receiving clock signals having a particular frequency and alternating between positive and negative half cycles,
regenerative means responsive to the input and reference signals to operate in a regenerative relationship during the negative half cycles of the clock signals dependent upon the differences between the input and reference signals,
degenerative means operatively coupled to the regenerative means for providing an operation of the regenerative means in a degenerative state for a particular period of time in the negative half cycles of the clock signals and for thereafter providing an operation of the regenerative means in the regenerative state in the remainder of the negative half cycles of the clock signals, and
means operatively coupled to the fourth means for clamping the fourth means in the positive half cycles of the clock signals.

10. In a comparator as set forth in claim 9,
means connected to the regenerative means for indicating the results of the comparison by the regenerative means between the input and reference signals in the negative half cycles of the clock signals after the regenerative operation of the regenerative means in the remainder of such negative half cycles.

11. In a comparator as set forth in claim 10,
the regenerative means being conductive during the negative half cycles of the clock signals and being cross-coupled to provide for the regenerative state of the regenerative means during such conductivity, and
the degenerative means having characteristics to limit the conductivity of the regenerative means in the negative half cycles of the clock signals until such conductivity has reached a level where the regenerative means is responsive only to the difference between the input and reference signals.

12. In a combination as set forth in claim 9,
the regenerative means and the degenerative means being constructed to provide substantially matching conductances.

13. In combination in a comparator constructed to prevent the comparator from responding to noise signals,
means for receiving an input signal,
means for receiving a reference signal,
means for receiving at a particular frequency first clock signals having positive and negative half cycles of equal duration,
means for receiving at the particular frequency second clock signals having positive and negative half cycles of unequal duration, the positive half cycles in the second clock signals being longer than the negative half cycles in the clock signals,
regenerative means responsive to the input and reference signals during the negative half cycles of the first clock signals and operative on a regenerative basis during such negative half cycles of the first clock signals to provide an output indicative of the difference between the input and reference signals,
degenerative means operatively coupled to the regenerative means and responsive to the input and reference signals for degenerating the regenerative nature of the regenerative means during the time that the first clock signals are negative and the second clock signals are positive, and
clamping means for clamping the regenerative means during the positive half cycles of the first clock signals.

14. A combination as set forth in claim 13 wherein the regenerative means includes a first pair of cross-coupled transistors connected to operate in the regenerative nature during the negative half cycles of the first clock signals and the degenerative means includes a second pair of transistors each connected to an individual one of the cross-coupled transistors in the regenerative means to provide the degenerative in the regenerative nature of each of such cross-coupled transistors during the time that the first clock signals are negative and the second clock signals are positive.

15. In a combination as set forth in claim 14,
the transistors in the first pair having substantially matching characteristics and the transistors in the second pair having substantially matching characteristics and the transistors in the second pair being larger than the transistors in the first pair.

16. In a combination as set forth in claim 15,
means connected to the transistors in the first pair and to the transistors in the second pair for providing the transistors in the first pair with a balanced operation relative to the operation of the transistors in the second pair.

17. In a combination as set forth in claim 16,
the means operatively coupled to the transistors in the degenerative means including a transistor responsive to the second clock signals to become conductive in the positive half cycles of the second clock signals and such transistor being connected to the transistors in the second pair to obtain a conductivity of the transistors in the second pair during the time that the first clock signals are negative and the second clock signals are positive.

18. In a combination as set forth in claim 17,
means including an additional transistor operatively coupled to the transistors in the first pair for obtaining a balanced operation of the transistors in the first pair during the time that the first clock signals are negative and the second clock signals are positive.

19. In combination in a comparator constructed to prevent noise from affecting the operation of the comparator,
means for receiving an input signal,
means for receiving a reference signal,
means for receiving at a particular frequency first clock signals alternately having positive and negative half cycles of equal duration,
means for receiving at the particular frequency second clock signals alternately having positive and negative half cycles of unequal duration, the positive half cycles in the second clock signals being longer than the negative half cycles in the second clock signals,
regenerative means including a first pair of transistors responsive to the input and reference signals and cross coupled to provide a regenerative response to the input and reference signals in the negative half cycles of the first clock signals,
degenerative means including a second pair of transistors responsive to the input and reference signals to degenerate the regenerative response of the regenerative means during the time that the first clock signals are negative and the second clock signals are positive, and
means for clamping the transistors in the regenerative means during the positive half cycles of the first clock signals.

20. In a combination as set forth in claim 19,
the transistors in the first and second pairs having substantially the same characteristics.

21. In a combination as set forth in claim 19,
each of the transistors in the regenerative means being operatively coupled to an individual one of the transistors in the degenerative means, and
means operatively coupled to the transistors in the second pair and including a transistor responsive to the second clock signals for obtaining the conductivity of the transistors in the second pair, during the time that the first clock cycles are negative and the second clock cycles are positive, to degenerate the regenerative response of the transistors in the first pair during such time.

22. In a combination as set forth in claim 21,
means including an additional transistor in the regenerative means for providing, with the transistor responsive to the second clock signals, a balanced operation during the time that the first clock signals are negative and the second clock signals are positive.

23. In a combination as set forth in claim 22,
the transistors in the degenerative means being larger than the transistors in the regenerative means to assure the degeneration in the regenerative response of the transistors in the regenerative means during the time that the first clock signals are negative and the second clock signals are positive.

* * * * *